(12) United States Patent       (10) Patent No.: US 8,951,809 B2
Moulet et al.                   (45) Date of Patent: Feb. 10, 2015

(54) METHOD OF TRANSFER BY MEANS OF A FERROELECTRIC SUBSTRATE

(75) Inventors: Jean-Sebastien Moulet, Chambery (FR); Lea Di Cioccio, Saint Ismier (FR); Marion Migette, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 1065 days.

(21) Appl. No.: 12/936,582

(22) PCT Filed: Apr. 3, 2009

(86) PCT No.: PCT/EP2009/054007
§ 371 (c)(1),
(2), (4) Date: Dec. 15, 2010

(87) PCT Pub. No.: WO2009/124886
PCT Pub. Date: Oct. 15, 2009

(65) Prior Publication Data
US 2011/0104829 A1    May 5, 2011

(30) Foreign Application Priority Data
Apr. 7, 2008 (FR) ..................... 08 52302

(51) Int. Cl.
    H01L 21/00    (2006.01)
    H01L 21/18    (2006.01)
(52) U.S. Cl.
    CPC ........... *H01L 21/187* (2013.01); *Y10S 414/135* (2013.01); *Y10S 414/141* (2013.01)
    USPC ............................. 438/3; 414/935; 414/941
(58) Field of Classification Search
    USPC ....................... 414/935, 941; 438/3
    See application file for complete search history.

(56) References Cited

U.S. PATENT DOCUMENTS

| 5,467,002 A | 11/1995 | Brooks |
| 5,536,354 A | 7/1996 | Akaike et al. |
| 5,652,173 A | 7/1997 | Kim |
| 5,874,747 A | 2/1999 | Redwing et al. |

(Continued)

FOREIGN PATENT DOCUMENTS

| EP | 0 621 130 A2 | 10/1994 |
| EP | 0 621 130 A3 | 10/1994 |

(Continued)

OTHER PUBLICATIONS

French preliminary Search Report issued Dec. 22, 2008, in Patent Application No. FR 0852302 (with English translation of Cited Documents).

(Continued)

*Primary Examiner* — Ha Tran T Nguyen
*Assistant Examiner* — Aaron Dehne
(74) *Attorney, Agent, or Firm* — Oblon, Spivak, McClelland, Maier & Neustadt, L.L.P.

(57) ABSTRACT

A method of carrying out a transfer of one or more first components or of a first layer onto a second substrate including: a) application and maintaining, by electrostatic effect, of the one or more first components or of the first layer, on a first substrate, made of a ferroelectric material, electrically charged, b) placing in contact, direct or by molecular adhesion, and transfer of the components or the layer onto a second substrate, and c) dismantling of the first substrate, leaving at least one part of the components or the layer on the second substrate.

22 Claims, 9 Drawing Sheets

(56) References Cited

U.S. PATENT DOCUMENTS

| | | |
|---|---|---|
| 6,010,579 A | 1/2000 | Henley et al. |
| 6,284,628 B1 | 9/2001 | Kuwahara et al. |
| 6,426,270 B1 | 7/2002 | Sakaguchi et al. |
| 6,468,923 B1 | 10/2002 | Yonehara et al. |
| 6,500,732 B1 | 12/2002 | Henley et al. |
| 6,524,935 B1 | 2/2003 | Canaperi et al. |
| 6,537,370 B1 | 3/2003 | Hernandez et al. |
| 6,573,126 B2 | 6/2003 | Cheng et al. |
| 6,596,610 B1 | 7/2003 | Kuwabara et al. |
| 6,690,043 B1 | 2/2004 | Usuda et al. |
| 6,890,835 B1 | 5/2005 | Chu et al. |
| 6,936,523 B2 | 8/2005 | Berne et al. |
| 7,052,979 B2 | 5/2006 | Nagai et al. |
| 7,256,075 B2 | 8/2007 | Ghyselen et al. |
| 7,268,060 B2 | 9/2007 | Ghyselen et al. |
| 7,297,611 B2 | 11/2007 | Maleville |
| 7,375,008 B2 | 5/2008 | Ghyselen et al. |
| 7,602,046 B2 | 10/2009 | Ghyselen et al. |
| 2002/0125475 A1 | 9/2002 | Chu et al. |
| 2003/0010275 A1 | 1/2003 | Radojevic et al. |
| 2004/0029365 A1 | 2/2004 | Linthicum et al. |
| 2004/0053477 A1 | 3/2004 | Ghyselen et al. |
| 2004/0185638 A1 | 9/2004 | Kakizaki et al. |
| 2005/0026426 A1 | 2/2005 | Maleville et al. |
| 2005/0029224 A1 | 2/2005 | Aspar et al. |
| 2005/0083634 A1* | 4/2005 | Breitschwerdt et al. ...... 361/234 |
| 2005/0150447 A1 | 7/2005 | Ghyselen et al. |
| 2005/0189323 A1 | 9/2005 | Ghyselen et al. |
| 2005/0196937 A1 | 9/2005 | Daval et al. |
| 2005/0248378 A1 | 11/2005 | Gibson et al. |
| 2006/0270188 A1* | 11/2006 | Kanemitsu et al. ........... 438/455 |
| 2007/0048891 A1* | 3/2007 | Hayashi et al. ................ 438/66 |
| 2007/0087526 A1 | 4/2007 | Chhaimi et al. |
| 2008/0271835 A1 | 11/2008 | Di Cioccio et al. |
| 2009/0325362 A1 | 12/2009 | Chhaimi et al. |
| 2010/0167500 A1 | 7/2010 | Chhaimi et al. |
| 2011/0033976 A1 | 2/2011 | Di Cioccio et al. |

FOREIGN PATENT DOCUMENTS

| | | |
|---|---|---|
| EP | 1 156 531 A1 | 11/2001 |
| EP | 1 588 415 AO | 10/2005 |
| EP | 1 777 735 A2 | 4/2007 |
| EP | 1777735 A2 * | 4/2007 |
| FR | 2 775 121 | 8/1999 |
| FR | 2 892 228 | 4/2007 |
| JP | 4-100256 A | 4/1992 |
| JP | 11-307413 | 11/1999 |
| JP | 2002-141282 | 5/2002 |
| JP | 2005-64194 A | 3/2005 |
| JP | 2007-208031 A | 8/2007 |
| JP | 2008-41927 A | 2/2008 |
| WO | WO 97/42654 | 11/1997 |
| WO | WO 99/41776 | 8/1999 |
| WO | WO 00/15885 | 3/2000 |
| WO | WO 00/77846 A1 | 12/2000 |
| WO | WO 01/15215 A1 | 3/2001 |
| WO | WO 01/93325 A1 | 12/2001 |
| WO | WO 02/27783 A1 | 4/2002 |
| WO | WO 2004/061943 A1 | 7/2004 |
| WO | WO 2006/093817 A2 | 9/2006 |

OTHER PUBLICATIONS

A. Jourdain, et al., "BCB Collective Hybrid Bonding for 3D-Stacking", Conference on Wafer Bonding for MEMS Technologies and Wafer Level Integration, Dec. 9-11, 2007, pp. 57-58 (plus cover page).

B. Aspar, et al., "Silicon Wafer Bonding Technology for VLSI and MEMS applications", edited by S. S. Iyer, et al., INSPEC, Chapter 3, ("Smart Cut : the technology used for high volume SOI wafer production"), 2002, pp. 35-52.

B. Holländer, et al., "Strain relaxation of pseudomorphic $Si_{1-x}Ge_x$/Si(100) heterostructures after hydrogen or helium ion implantation for virtual substrate fabrication", Nuclear Instruments and Methods in Physics Research B 175-177, (Elsevier), 2001, pp. 357-367.

R. T. Leonard, et al., "Photoassisted dry etching of GaN", Applied Physics. Lett., vol. 68, No. 6, Feb. 5, 1996, pp. 794-796.

S. J. Pearton, et al., "Low bias electron cyclotron resonance plasma etching of GaN, AlN, and InN", Applied Physics. Lett., vol. 64, No. 17, Apr. 25, 1994, pp. 2294-2296.

L. J. Huang, et al., "SiGe-on insulator prepared by wafer bonding and layer transfer for high-performance field-effect transistors", Applied Physics Letters, vol. 78, No. 9, Feb. 26, 2001, pp. 1267-1269.

Shuji Nakamura, "InGaN/GaN/AlGaN-Based Laser Diodes with an Estimated Lifetime of Longer than 10,000 Hours", MRS Bulletin, vol. 23, No. 5, May 1998, pp. 37-43.

Office Action issued Dec. 3, 2013 in Japanese Patent Application No. 2011-503408 with English language translation.

Decision of Rejection issued Sep. 29, 2014 in Japanese Patent Application No. 2011-503408 (with English translation).

* cited by examiner

METHOD OF TRANSFER BY MEANS OF A FERROELECTRIC SUBSTRATE

TECHNICAL FIELD AND PRIOR ART

The invention relates to substrate transfer techniques, which are used in particular in microelectronics.

In this field, it is often aimed to use a temporary support, also known as a "handle". On such a support may be temporarily fixed one or more components, which may then again be transferred onto another, definitive support. The support or the handle substrate may then be reused for another transfer.

The problem is often posed of being able to detach in a simple manner the component(s) that have been fixed temporarily onto the handle substrate.

Moreover, components tend to be smaller and smaller, and known transfer techniques, and thus the substrates commonly used as handles, are not always adapted to constantly decreasing dimensions.

DESCRIPTION OF THE INVENTION

The invention relates to a method of carrying out a transfer of one or more first components or of a first layer on a first substrate to a second substrate, comprising the following steps:

a) the placing in contact, against the first substrate, made of a ferroelectric material, of the first component(s) or the first layer, and maintaining them by electrostatic effect against this first substrate, b) a placing in contact, direct or by molecular adhesion, of these first components or this first layer with the second substrate, c) a separation or a dismantling of the first substrate, leaving at least one part of each of said components or of said layer on the second substrate.

Step a) implements the internal field of the substrate made of ferroelectric material, which is charged in an intrinsic manner.

Consequently, there are no leaks of charges and the polarisation may be maintained as is as long as there are no discharges by an exterior intervention. There is thus no time limit to the use of the assembly between the first substrate and the components or the first layer.

The dismantling of the first substrate may be assisted:

thermally, in particular by effect of the difference in thermal expansion between the first and the second substrate, or by application of a rapid thermal ramp (greater than or equal to 5° C./min), which introduces a discharge effect by accumulation of charges. A rise in temperature moreover enables the direct contact to be reinforced, and/or mechanically, in particular by an effect of bending the second substrate, which induces a disbondment of the first substrate 1, the bonding of the components being stronger at the interface with the second substrate. The direct contact of the component(s) on the second substrate is going to make it possible to retain them on it when the first substrate is going to be moved away, and/or in an electrostatic manner, in particular by inversion of the polarisation by heating or by an inverse polarisation.

Advantageously, the ferroelectric material of the first substrate is LTO ($LiTaO_3$) or a material of same structure as LTO, such as $LiNbO_3$, $BaTiO_3$, or $SrTiO_3$, or $LaAlO_3$, or $LiAlO_3$, or any other ferroelectric material.

Advantageously, it is possible to carry out on the surface of the second substrate a preparation for the purpose of a molecular bonding, the components or the layer then being placed in contact with this prepared surface and assembled with it by molecular bonding.

One or more of said components, or said layer, may have undergone, before step a), or undergo, between step a) and step b), a treatment by etching, and/or ion implantation, and/or deposition and/or a thermal treatment.

In the case of a treatment by ion implantation before step a), or between step a) and step b), a fragilization area is formed in at least one of said components or said layer, along which a fracture is made during step c).

In the case of a treatment by ion implantation before step a), a fragilization area is formed in at least one of said components or said layer, along which a fracture is made between step a) and step b).

Depending on the depth of the implantation and the face of the components or the layer traversed by the implantation, the layer transferred during step c) may be more or less thick.

A layer may be deposited on the surface of the ferroelectric material, to promote the bonding, for example a layer of silicon oxide $SiO_2$ or a polymer (PDMS, BCB) with weak or very weak strength or adhesion.

The transfer operation may be carried out in several stages, in particular by means of the same first ferroelectric substrate, a layer being thus transferred, or components being thus transferred, onto an already transferred layer, or onto already transferred components, which makes it possible to form stacks or stages of components on a same second substrate.

Thus the object of the invention is also a method of carrying out a transfer of at least two stages of components and/or layer onto a second substrate, comprising the following steps:

carrying out a transfer of a first stage of one or more first components or of a first layer onto said second substrate, according to the invention disclosed above, by means of a first substrate, made of a ferroelectric material, then the carrying out of a transfer of a second stage of one or more second components or of a second layer, onto said first stage.

The transfer of a second stage may be carried out by:

a') the application and the maintaining, by electrostatic effect, of said one or more second components or said second layer, on said first stage, by means of a substrate, made of a ferroelectric material, electrically charged, b') a placing in contact and a transfer of these components or this layer onto said first stage, c') a dismantling of said substrate made of a ferroelectric material, leaving the component(s) or said second layer on the first stage.

The transfer of the first stage may be carried out with the same substrate, made of a ferroelectric material, as the transfer of the second stage.

Whatever the embodiment, a method according to the invention enables a novel method of handling a film or stamps, while having a temporary support, by electrostatic bonding.

DETAILED DESCRIPTION OF SPECIFIC EMBODIMENTS

A first example of method according to the invention will be given with reference to FIGS. 1A-1C, starting with a first substrate 2, solid or in thin film, made of ferroelectric material, for example $LiTaO_3$. This type of material, just as the other ferroelectric materials that can be used cited above, have an intrinsic polarisation that is going to be able to be exploited within the scope of the present invention.

Figure 1A:
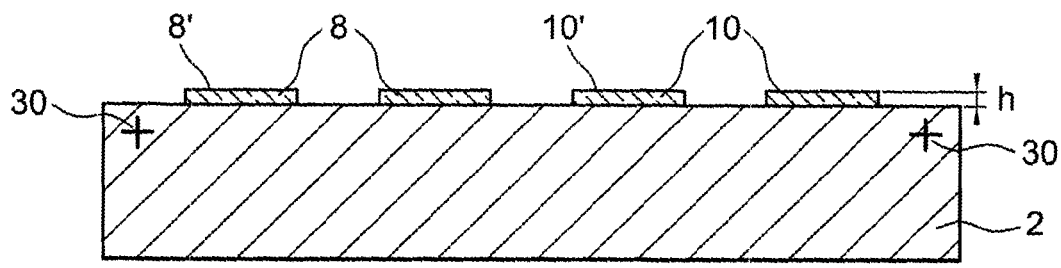
FIGS. 1A-1D represent a first embodiment of the invention.

Components 8, 10, for example of the "stamp" type (hereafter, the term component or stamp are used indiscriminately) are deposited on this substrate 2 (FIG. 1A). These components are for example substrates of semi-conductor materials, comprising, or not, circuits. They are mainly based on silicon or germanium or AsGa or InP or other materials.

The reference 30 designates possible alignment marks on the substrate 2, which will make it possible to achieve later a good alignment on a second substrate 20, or transfer substrate, particularly if alignment marks are also provided on the second substrate 20.

These components 8, 10 may be of all sizes, they are for example chips. Each side of one of these components may measure between several micrometers and several millimeters or several centimeters, for example between 1 μm or 5 μm and 1 mm or 5 mm or 5 cm.

The dimensions, and in particular the thickness of each component, may be such that they cannot be handled individually. In particular, its thickness may be of the order of several nanometers to several tens of nanometers, for example between 5 nm or 10 nm and 50 nm. This is the case, in particular, of certain stamps or certain chips. A transfer technique according to the invention makes this stamp or this chip handleable.

The thickness of the components may also be higher, for example 750 μm or more, or even several millimeters.

The surfaces 8', 10' (FIG. 1A) of the various components may be arranged substantially at the same height h in relation to the surface 2' of the first substrate 2 on which these components are deposited.

In an alternative, these surfaces 8' and 10' may not be at the same height h in relation to this same surface 2' of the substrate 2. This is the case in particular if at least one of the components comprises at least one surface made of a material having an elasticity or compliant, for example a polymer. It has been shown by Jourdain et al. "*BCB Collective Hybrid Bonding for 3D-Stacking*" Conference on Wafer Bonding for MEMS Technologies and Wafer Level Integration, 2007 that a compliant polymer layer, for example made of BCB, can accept during transfers height differences of more than 3 mm.

Prior to the deposition, the components 8, 10 may have undergone a step of treatment for the purpose of promoting the contact or the adhesion with the surface 2' of the first substrate 2, for example a treatment by polishing or by plasma activation. This type of treatment may reveal, at the interface between the stamps and the surface 2' of the substrate 2, several monolayers of water.

Advantageously, it is possible to carry out the same type of preparation on the surface 20' of the second substrate 20, for the purpose of a molecular bonding. But said bonding 20-20' may also be achieved by means of adhesive.

The electrostatic adhesion of each component or stamp 8, 10 on the first substrate 2 is obtained by the natural electrical charges of this substrate 2. The spontaneous polarisation of the latter may be reinforced by the application of an electric field.

Once maintained on the substrate 2, the components 8, 10 may undergo one or more treatments, for example an etching, and/or an ion implantation, and/or a deposition, etc.; in the case of steps with elevation of temperature, the ramp(s) are chosen, during the thermal budget, in such a way as not to have a polarisation inversion phenomenon of the first substrate (ferroelectric); typically, one or more ramp(s) less than 5° C./minute are used. Moreover, the temperature is limited to a value less than the Curie temperature Tc of the ferroelectric material (for tantalate, this Curie temperature is equal to around 600° C.; for niobate it is around 1200° C.).

In an alternative, the components 8, 10 may be prepared for the purpose of a direct or molecular bonding with the surface 20' of the second transfer substrate 20, if necessary after, or in combination with, one or more of the previous treatments.

Figure 1B:
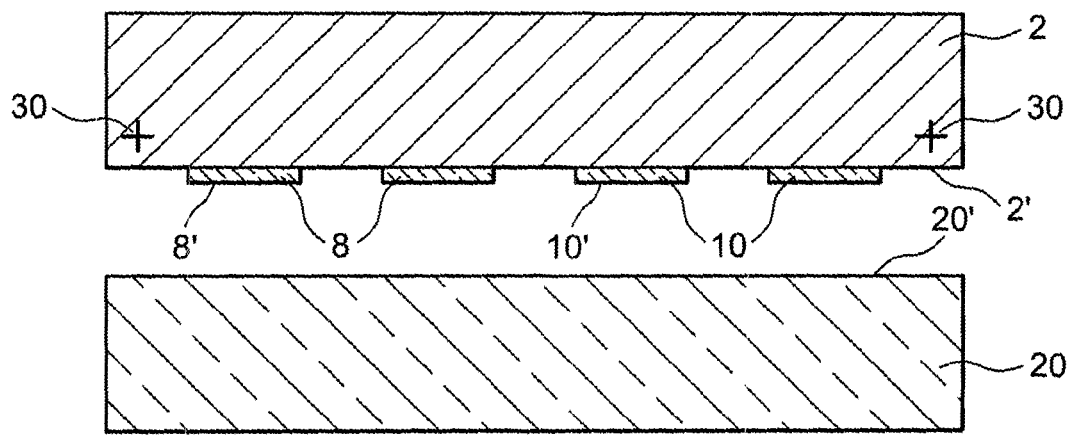
Figure 1C:
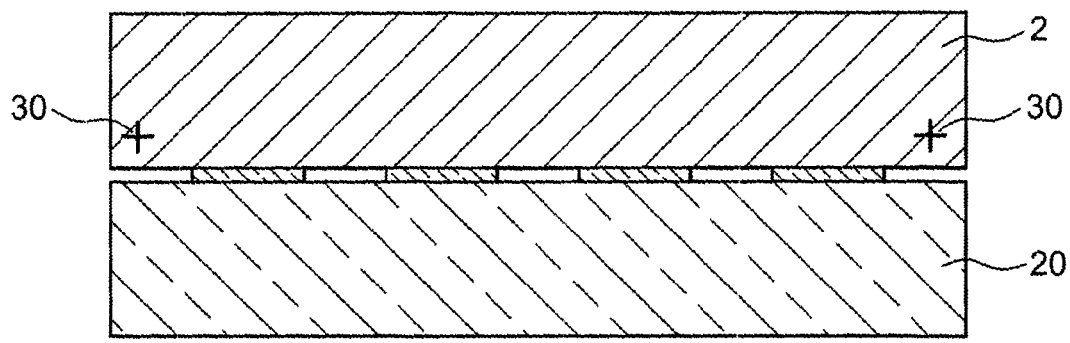

The assembly obtained may thus also, as illustrated in FIG. 1B, then be positioned facing such a transfer substrate 20, on which the components or the stamps are going to be transferred. The alignment mark(s) 30 may aid the relative positioning of the two substrates 2, 20.

The transfer substrate 20 is for example made of silicon or another semi-conductor material, or any other material such as fused silica or quartz.

The surface 8', 10' of the components or stamps 8, 10 and the surface 20' of the second substrate 20 (FIG. 1C) are placed in contact. The adhesion of the stamps on the latter is of molecular bonding type, which makes it possible to maintain them on the support or the second substrate 20, in a firmer manner than they are held, by electrostatic effect, on the first substrate 2. The latter may thus be removed (FIG. 1D), the components being transferred onto the substrate 20. There is thus a disbondment, or a separation, of the substrate 2 by mechanical effect, or due to the difference of adhesion force between the adhesion of the components or stamps 8, 10 on the ferroelectric substrate 2 and their adhesion on the substrate 20, the latter being greater. This may moreover bring about a difference of bending between the two substrates, which induces, or promotes, the disbondment. All of these steps are preferably carried out at ambient temperature, between 20° C. and 30° C. for example, except for the treatments of implantation and/or deposition type.

In an alternative, the disbondment may be obtained by thermal effect, or instead a thermal effect may assist the mechanical effect to disbond the stamps from the substrate 2.

More specifically, a step of heating makes it possible to carry out the separation of the components 8, 10 from the substrate 2. This heating (to temperature of several hundreds of ° C., for example between 100° C. or 500° C. and 1200° C., for a time between several minutes and several hours, for example between 1 h or 4 h and 10 h or even 30 h) also makes it possible to reinforce the direct or molecular adhesion of the components 8, 10 on the second substrate 20, compared to the adhesion on the substrate 2.

Under the effect of temperature, differences between the thermal expansion coefficients of the materials of the substrates 2 and 20 and/or between the thermal expansion coefficients of the materials of the substrate or substrates 2 and/or 20 and the stamps 8, 10 may also promote a disbondment of the first substrate. This is in particular the case if the thermal expansion coefficient of the material of the first substrate is greater than that of the stamps 8, 10. This condition is met for LTO (just as for the other ferroelectric materials already envisaged for the substrate 2), which expands in general more than the stamps (mainly made of semi-conductor material). The latter thus do not move or barely move.

During the disbondment step, an increasing thermal ramp may be applied. In particular, under the effect of a thermal ramp greater than 5° C./min, an accumulation of charges in the material of the substrate 2 enables a discharge of the latter and thus enables or promotes the disbondment.

A disbondment of the substrate 2 is thus carried out by thermal effect or by combination of mechanical and thermal or electrical and thermal effects.

Figure 1D:
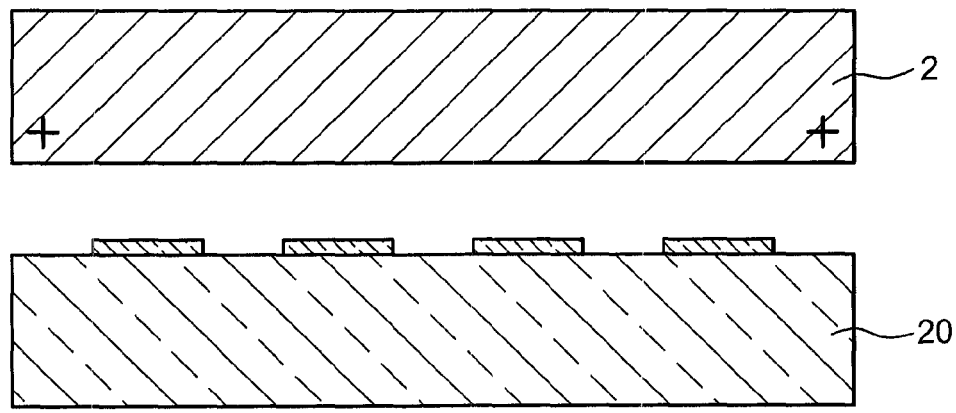

Another embodiment of the invention will be explained starting with a second substrate 20, identical or similar to that of FIG. 1D, thus to which a plurality of stamps 8, 10, forming a first stage, already adhere. Components 8", 10", for example of the same type as those mentioned above, are going to be deposited on this first stage.

By the same transfer technique as that already described by means of the ferromagnetic substrate 2, the second stage of components 8", 10", etc. may be deposited on the first stage of components 8, 10. The bond between 8 and 8", 10 and 10" may be of the same nature as the previous bond between substrate 20 and components 8, 10, it may also be achieved by means of adhesive. This transfer of a second stage may be carried out by means of the same ferroelectric substrate 2 as the transfer of the first stage.

Figure 2A:
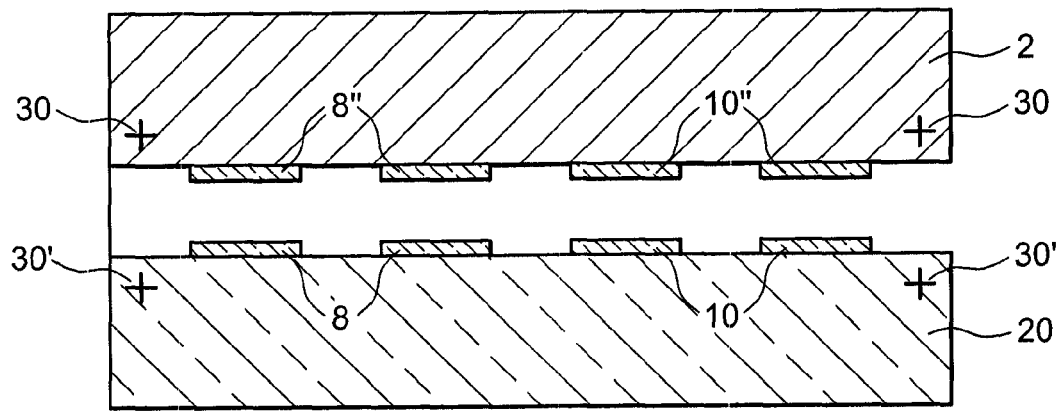
FIGS. 2A-2B represent a second embodiment of the invention, with transfer of two stages.

Once again, an appropriate marking made for example both on the substrate 2 and the substrate 20, makes it possible to achieve a good alignment and a good superposition of the components on top of each other. Marks 30, 30' are identified in the substrates 2, 20 of FIG. 2A.

This alternative of the invention makes it possible to form stacks or stages of components on the second substrate 20.

Figure 2B:
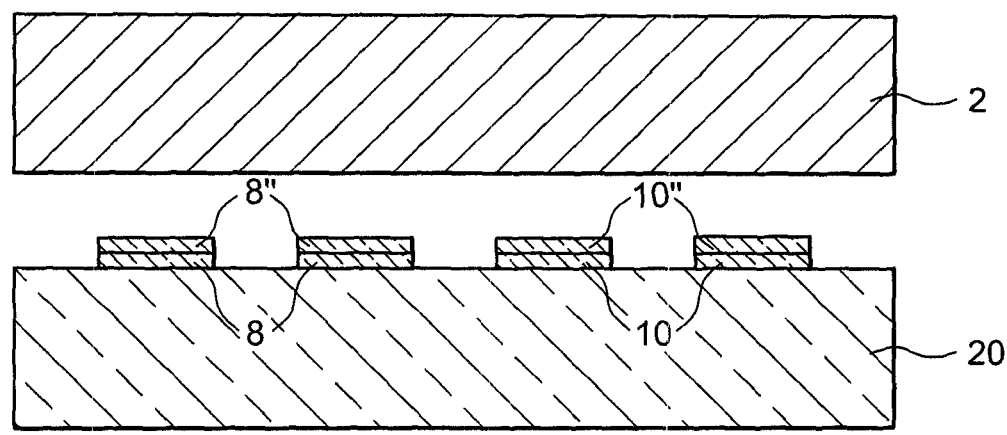

In FIG. 2B a component or a stamp 8", 10" is indicated in superposition of each component or stamp 8, 10, but this is not obligatory, the distribution of the components or stamps 8", 10" on the first stage may be different. In this figure, the substrate 2 is represented, as explained above, after having been disbonded or separated by the components 8", 10" by thermal effect or by combination of mechanical and thermal or electrical and thermal effects.

Figure 3A:
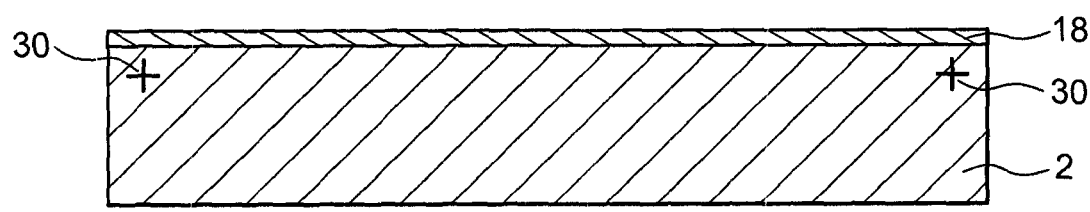
FIGS. 3A-3D represent a method according to the invention, with transfer of a layer.
Figure 3B:
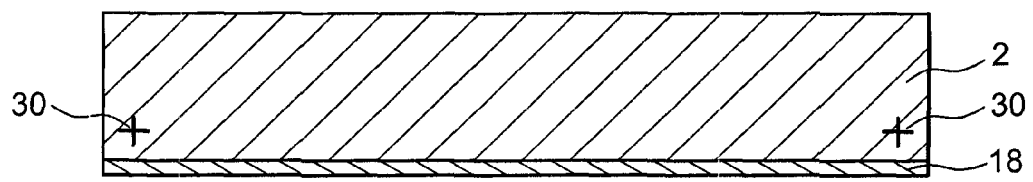
Figure 3C:
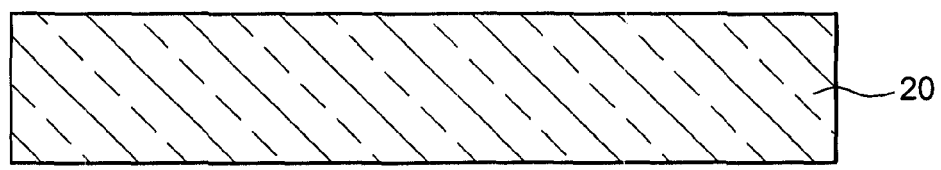

What has been described for individual components or stamps applies to a single layer: as illustrated in FIGS. 3A-3C, it is possible to maintain a complete layer 18, for example made of at least one of the semi-conductor materials already cited, on the ferroelectric substrate 2 (if necessary provided, once again, with alignment marks 30). Then, a transfer is carried out on the substrate 20 (FIGS. 3B and 3C), with assistance of one or more of the effects already mentioned (mechanical, and/or thermal, and/or electrostatic). The first stage is thereby formed.

Figure 3D:
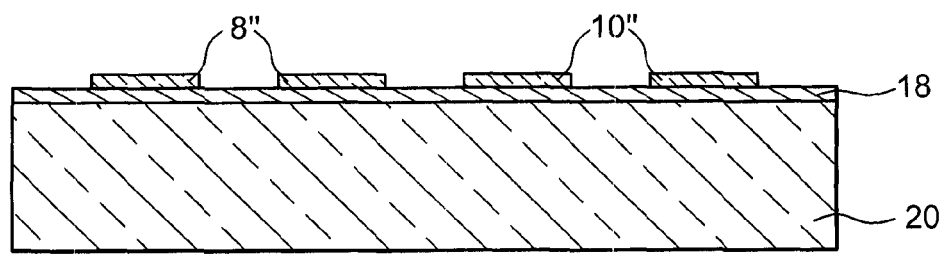

A second stage may be transferred onto the layer 18 of FIG. 3C, this may be a stage of components or stamps 8", 10" or a stage comprising a second layer. FIG. 3D represents the result of a double transfer, firstly that of a layer 18, then, on this layer, components 8", 10".

This transfer of a second stage may be carried out by means of the same ferroelectric substrate 2 as the transfer of the first stage, and according to one of the methods described above.

Another embodiment implements a method of substrate fracture, such as the "Smart Cut™" method, for example described in the article of B. Aspar and A. J. Auberton—Hervé "Silicon Wafer Bonding Technology for VLSI and MEMS applications", edited by S. S. Iyer and A. J. Auberton—Hervé, 2002, INSPEC, London, Chapter 3, pages 35-52, or instead in the documents already cited above.

FIGS. 4A to 4D illustrate an example of implementation of such a thin film producing or transferring method. These figures are cross-sectional views.

FIG. 4A shows the ferroelectric substrate of FIG. 3A, with its layer 18 as described above, but in an enlarged manner in FIG. 4A, undergoing a step of implantation of a gaseous species, symbolised by the arrows 3. For a silicon layer 18, it is possible for example to implant hydrogen at an energy of 200 keV and a dose of the order of $6.10^{16}$ $H^+/cm^2$. A buried area 19 is then formed constituting a fragilized area, which delimits two parts in the layer 18:

a thin film 21, of thickness between several nm and several hundreds of micrometers, for example between 10 nm and 200 μm, situated between the face 18', through which the implantation has taken place, and the fragilized area 19, and the remaining part 23 of the layer 18, situated between the fragilized area 19 and the substrate 20.

Figure 4A:
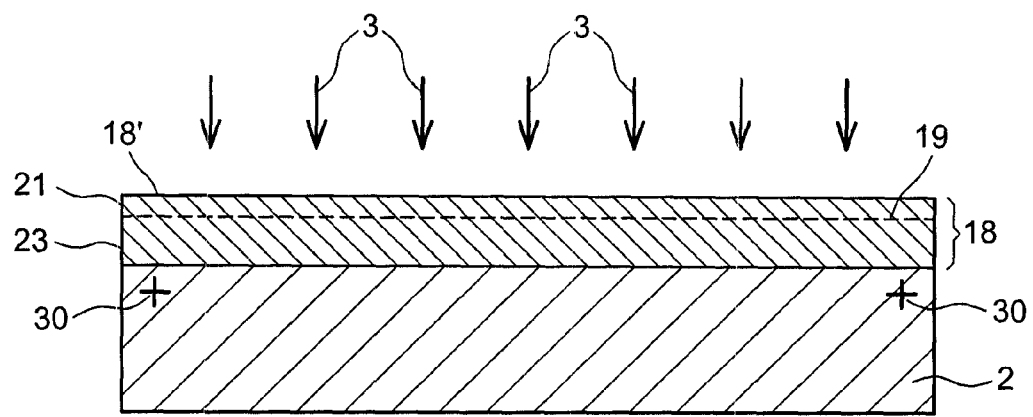
FIGS. 4A-4D represent another method of transfer of a portion of a layer, according to the invention, comprising a step of implantation and a step of fracture of said layer.
Figure 4B:
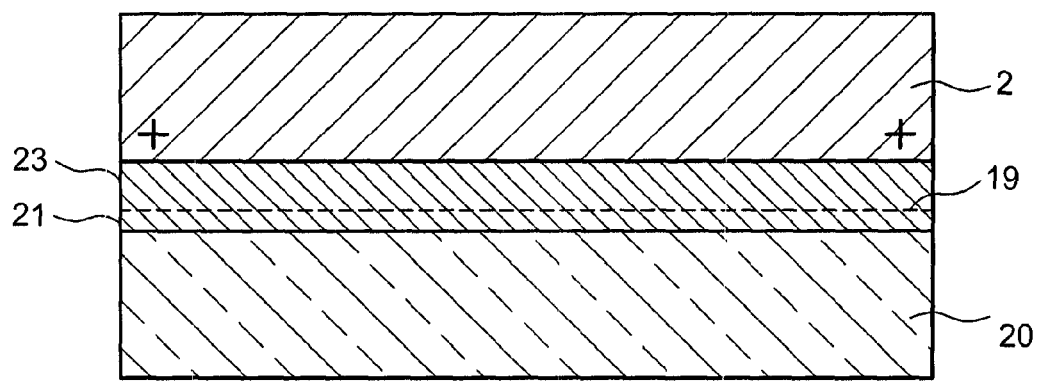

An assembly of the implanted layer 18 is then carried out, by its face 18' through which the implantation has been carried out, with the transfer substrate 20 (FIG. 4B).

For these operations, the techniques used are those already described above.

Figure 4C:
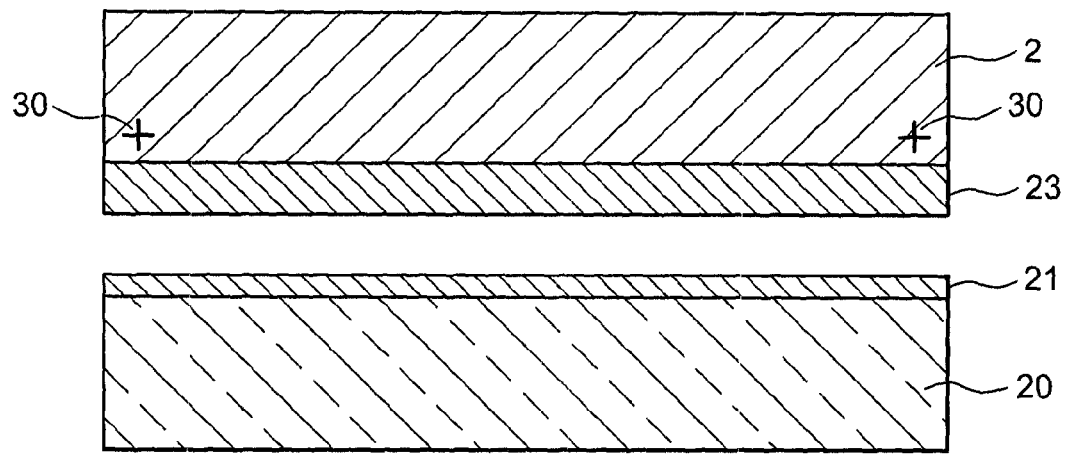
Figure 4D:
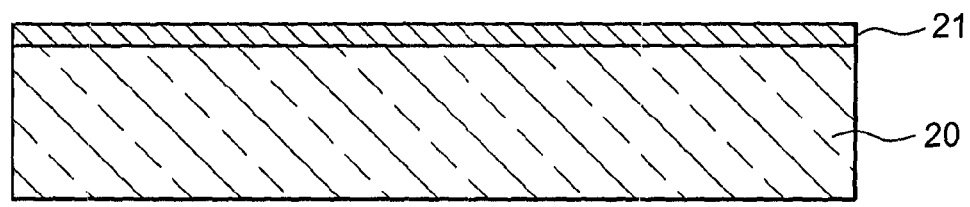

FIG. 4C illustrates a step of separation, induced by thermal and/or mechanical effect, of the thin film 21 and the remaining part 23 of the layer 18, along the fragilized area 19. The structure of FIG. 4D remains, namely the thin film 21 on the transfer substrate 20.

Figure 5A:
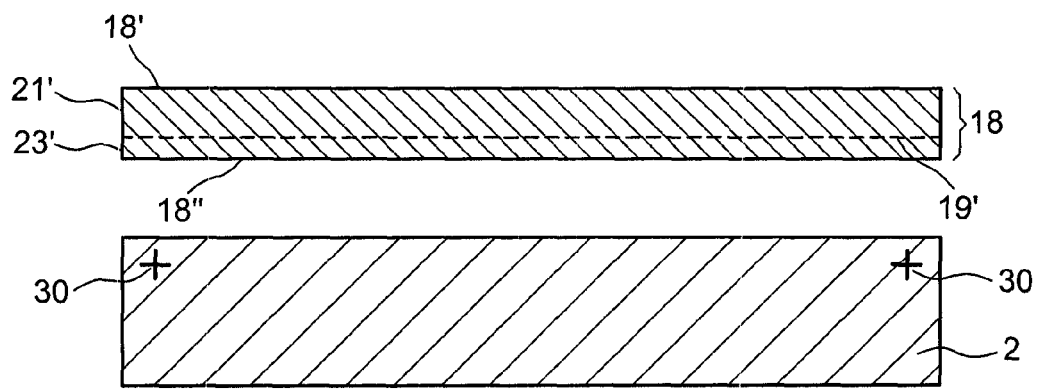
FIGS. 5A-5C represent yet another method of transfer of a portion of a layer, according to the invention, comprising a step of implantation and a step of fracture of said layer.

In an alternative (FIGS. 5A to 5C), an implantation in a layer (or a substrate) 18 is firstly carried out. In the case of silicon, reference will be made to the implantation values given above.

A buried area 19' is thus obtained constituting a fragilized area, which separates the layer 18 into two parts:

a thin film 23', of thickness between several nm and several hundreds of micrometers, for example between 10 nm and 200 μm, situated between the face 18" through which the implantation has taken place and the fragilized area 19', and the remaining part 21' of the layer, situated between the fragilized area 19' and the face 18' opposite to that by which the previous implantation took place.

An assembly (FIG. 5B) of the implanted layer 18 is then carried out, by its face 18" through which the implantation has been carried out, with the ferroelectric substrate 2.

Figure 5B:
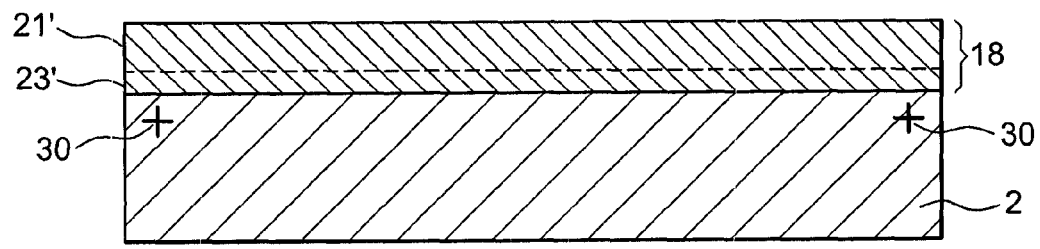
Figure 5C:
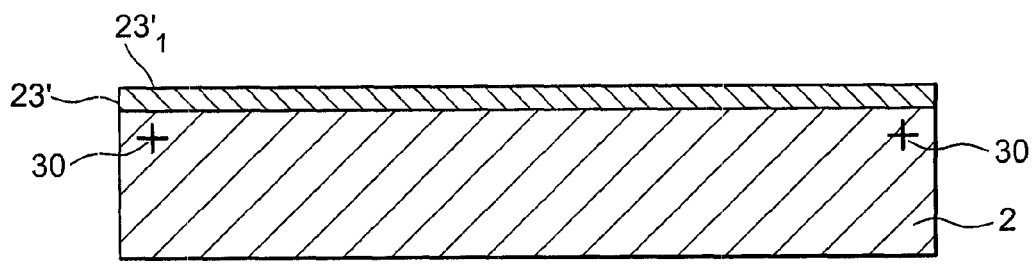

The structure of FIG. 5B is obtained. This structure is then subjected to a separation, induced by thermal and/or mechanical effect, of the thin film 23' and the remaining part 21' of the layer 18, along the fragilized area 19'. The result of this step is represented in FIG. 5C, the layer 23' being assembled with the substrate 2.

An assembly of the layer 23' is then carried out, by its free face 23'-1, with the transfer substrate 20: these are the steps described above with reference to FIG. 3A and following figures.

Figure 6A:
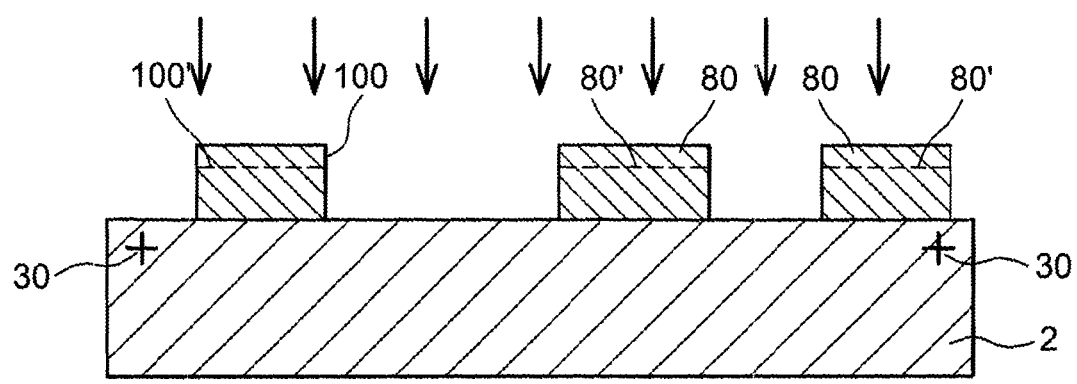
FIGS. 6A-6C represent another method of transfer of parts of stamps, according to the invention, comprising a step of implantation and a step of fracture of said stamps.
Figure 6B:
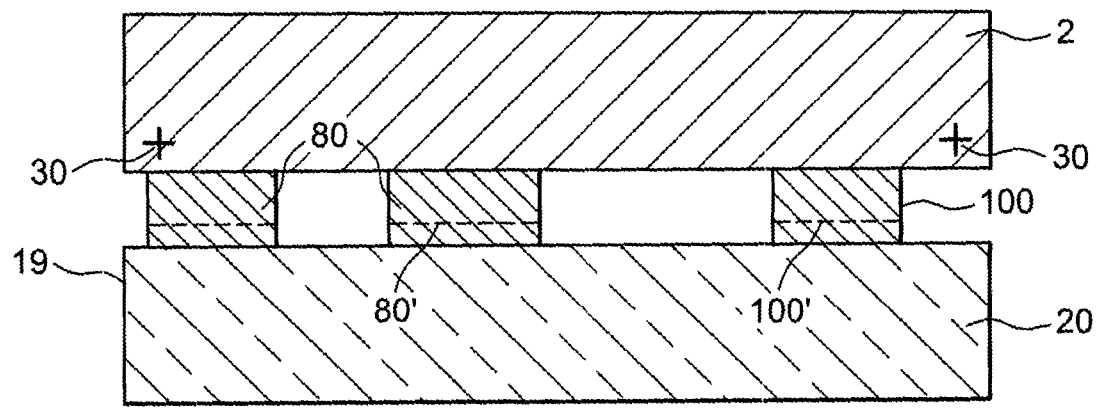
Figure 6C:
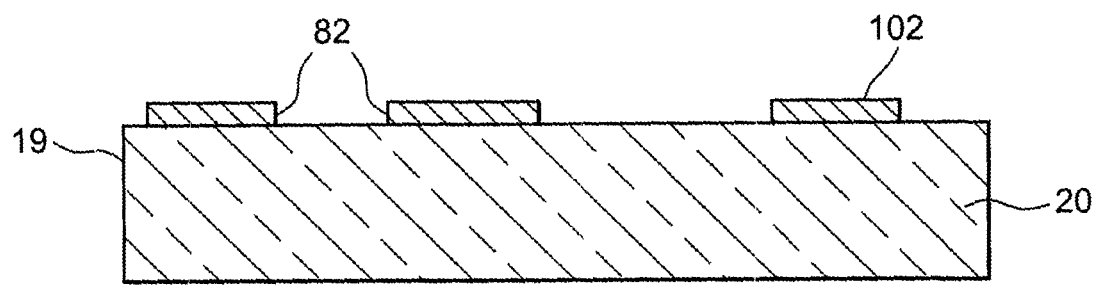

FIGS. 6A to 6C illustrate an example of implementation of a method of transferring implanted stamps.

The assembly of stamps with a ferroelectric substrate 2 is of the type described above with reference to FIG. 1A. The stamps 80, 100 of FIG. 6A are represented in an enlarged manner compared to those of FIG. 1A. The implantation takes place after this assembly with the substrate 2 and a fragilization area 80', 100' is thereby formed in each of the stamps 80, 100.

The corresponding steps are similar to those described above for FIGS. 4A-4E, but with stamps 80, 100 instead of a layer such as the layer 18. Thus FIG. 6B represents the assembly obtained after transfer of the stamps from substrate 2 onto the substrate 20, but before the step of separation.

After separation, a structure (FIG. 6C) results comprising, on the transfer substrate 20, a plurality of thin films 82, 102, each one of which results from the fracture of one of the stamps 80, 100 along the plane 80', 100'.

Figure 7A:
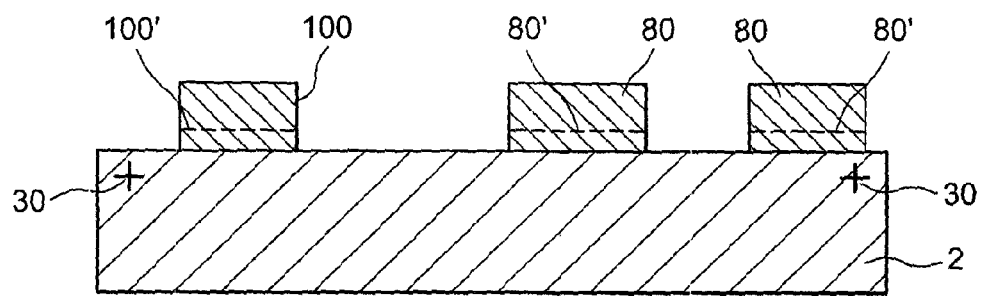
FIGS. 7A-7C represent yet another method of transfer of parts of stamps according to the invention, comprising a step of implantation and a step of fracture of said stamps.
Figure 7B:
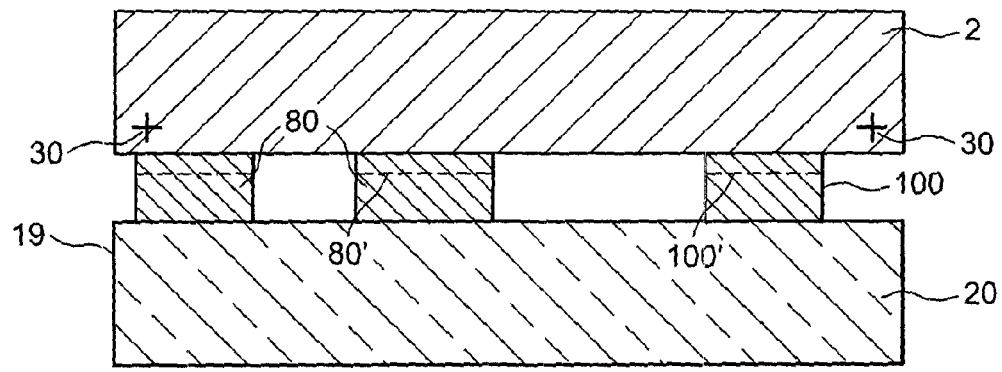
Figure 7C:
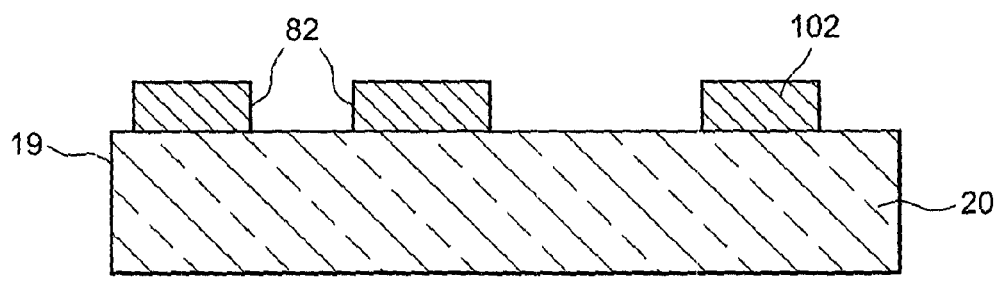

FIGS. 7A to 7C illustrate an example of implementation of a method of transferring implanted stamps.

The implantation takes place this time before assembly with the ferroelectric substrate 2 (thus before the step represented in FIG. 7A). A fragilization area 80', 100' has thus been formed in each of the stamps 80, 100, but this fragilization area is this time close to the surface of said stamps, which is assembled with the substrate 2.

The corresponding steps are similar to those described above for FIGS. 5A-5C, but with stamps 80, 100 instead of a layer such as the layer 18. Thus FIG. 7B represents the assembly obtained after transfer of the stamps from the substrate 2 onto the substrate 20, but before the step of separation.

After separation, a structure (FIG. 7C) results comprising, on the transfer substrate 20, a plurality of thin films 82, 102, each one of which results from the fracture of one of the stamps 80, 100 along the plane 80', 100'.

The invention claimed is:

1. A method of carrying out a transfer of one or more first components or of a first layer, from a first substrate to a second substrate, comprising:
    a) placing in contact, against the first substrate, made of a ferroelectric material, the one or more first components or the first layer, and maintaining them by electrostatic effect against the first substrate, the first substrate being electrically charged;
    b) placing in contact, direct or by molecular adhesion, the one or more first components or the first layer with the second substrate; and
    c) separating or dismantling the first substrate, leaving at least one part of each of the one or more first components or the first layer on the second substrate,
    wherein the separating or dismantling the first substrate is performed either
        (i) by inversion of the polarization of the first substrate, or
        (ii) by heating at a temperature of between 100° C. and 1,200° C.

2. The method according to claim 1, the c) separating or dismantling being assisted thermally and/or mechanically and/or in an electrostatic manner.

3. The method according to claim 2, the c) separating or dismantling being assisted by a rise in temperature.

4. The method according to claim 3, the rise in temperature being carried out by application of an increasing thermal ramp, of gradient greater than 5° C./min.

5. The method according to claim 1, the c) separating or dismantling being assisted by a difference between adhesion forces of the one or more first components or of the first layer on the first substrate and on the second substrate.

6. The method according to claim 1, the first substrate being charged in an intrinsic or assisted manner.

7. The method according to claim 1, the ferroelectric material of the first substrate being made of $LiTaO_3$, or $LiNbO_3$, or $BaTiO_3$, or $SrTiO_3$, or $LaAlO_3$, or $LiAlO_3$.

8. The method according to claim 1, the second substrate being at least partially made of semi-conductor material, or silicon, or fused silica, or quartz.

9. The method according to claim 1, the one or more first components or the first layer being at least partially made of semi-conductor material.

10. The method according to claim 1, the one or more first components, or the first layer, having undergone before the a) placing, or undergoing, between the a) placing and the b) placing, a treatment by etching, and/or ion implantation, and/or deposition, and/or a thermal treatment.

11. The method according to claim 10, the one or more first components, or the first layer, having undergone before the a) placing, or undergoing, between the a) placing and the b) placing, a treatment by ion implantation, defining in at least one of the one or more first components or in the first layer, a fragilization area, along which a fracture is formed during the c) separating or dismantling.

12. The method according to claim 10, the one or more first components, or the first layer, having undergone, before the a) placing, a treatment by ion implantation, defining in at least one of the one or more first components or in the first layer, a fragilization area, along which a fracture is formed between the a) placing and the b) placing.

13. The method according to claim 10, the thermal treatment not inducing polarization inversion of the material of the first substrate.

14. The method according to claim 13, the thermal treatment being carried out by application of an increasing thermal ramp, of gradient less than 5° C./min.

15. The method according to claim 1, at least one of the one or more first components, or the first layer, and/or a surface of the first substrate having undergone at least one treatment for promoting contact or adhesion of the component with the surface.

16. The method according to claim 1, a surface of the second substrate and/or a surface of at least one of the one or more first components or of the first layer, having undergone, before the b) placing, a preparation for molecular bonding.

17. The method according to claim 1, a surface of one of the one or more first components not being at a same height as a surface of at least another one of the one or more first components in relation to a surface of the second substrate on which the one or more first components are deposited.

18. The method according to claim 1, at least one of the one or more components comprising at least one surface made of a compliant or elastic material.

19. A method of carrying out a transfer of at least two stages of components and/or of layers onto a second substrate, comprising:
    carrying out a first transfer of a first stage of one or more first components or of a first layer from a first substrate onto said second substrate, comprising:
        a) placing in contact, against the first substrate, made of a ferroelectric material, the one or more first components or the first layer, and maintaining them by electrostatic effect against the first substrate, the first substrate being electrically charged;
        b) placing in contact, direct or by molecular adhesion, the one or more first components or the first layer with the second substrate; and
        c) separating or dismantling the first substrate, leaving at least one part of each of the one or more first components or of the first layer on the second substrate,
    then carrying out a second transfer of a second stage of one or more second components or of a second layer, onto the first stage.

20. The method according to claim 19, the transfer of the second stage being carried out by:

a') applying and maintaining, by electrostatic effect, the one or more second components or the second layer, on the first stage, by a third substrate, made of the ferroelectric material and being electrically charged;

b') placing in contact and transferring the one or more second components or the second layer onto the first stage; and c') separating or dismantling the third substrate, leaving the one or more second components or the second layer on the first stage.

21. The method according to claim 20, wherein the third substrate and the first substrate are the same substrate.

22. A method of carrying out a transfer of one or more first components or of a first layer, from a first substrate to a second substrate, comprising:

a) placing in contact, against the first substrate, made of a ferroelectric material, the one or more first components or the first layer, and maintaining them by electrostatic effect against the first substrate, the first substrate being electrically charged;

b) placing in contact, direct or by molecular adhesion, the one or more first components or the first layer with the second substrate; and c) separating or dismantling the first substrate, leaving at least one part of each of the one or more first components or the first layer on the second substrate, wherein the one or more first components, or the first layer, having undergone, before the a) placing, a treatment by ion implantation, defining in at least one of the one or more first components or in the first layer, a fragilization area, along which a fracture is formed between the a) placing and the b) placing.

* * * * *